United States Patent
Nishizaki (10) Patent No.: US 9,048,114 B2
(45) Date of Patent: Jun. 2, 2015

(54) ELECTRONIC DEVICE WITH AN ACTIVE REGION AND TRANSISTORS

(71) Applicant: PS4 Luxco S.a.r.l., Luxembourg (LU)

(72) Inventor: Mamoru Nishizaki, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 68 days.

(21) Appl. No.: 13/906,740

(22) Filed: May 31, 2013

(65) Prior Publication Data

US 2013/0320439 A1     Dec. 5, 2013

(30) Foreign Application Priority Data

Jun. 4, 2012   (JP) .................. 2012-126969

(51) Int. Cl.
*H01L 29/66* (2006.01)
*H01L 27/085* (2006.01)
*H01L 27/02* (2006.01)
*H01L 27/088* (2006.01)
*H01L 27/092* (2006.01)
*H01L 27/108* (2006.01)

(52) U.S. Cl.
CPC .......... *H01L 27/085* (2013.01); *H01L 27/0207* (2013.01); *H01L 27/088* (2013.01); *H01L 27/092* (2013.01); *H01L 27/10873* (2013.01)

(58) Field of Classification Search
USPC ......... 257/151–153, 249, 314–320, 366, 387, 257/412, E29.125–E29.131, 257/E29.134–E29.138, E29.14–E29.161, 257/E29.275, E29.319, E21.176–E21.186, 257/E21.374, E21.458, E21.621–E21.624, 257/E21.635–E21.638, E21.421, E21.455, 257/E21.623, E21.637, 118, 224, 328–333, 257/466, 531, 594, 288, 401, 901, 225–234, 257/390, E27.076; 438/157, 176, 195, 267, 438/283, 585–596
See application file for complete search history.

(56) References Cited

U.S. PATENT DOCUMENTS

| | | | | |
|---|---|---|---|---|
| 6,940,106 | B2 * | 9/2005 | Shino ............................ | 257/206 |
| 8,410,547 | B2 * | 4/2013 | Cho et al. ...................... | 257/330 |
| 2005/0110070 | A1 * | 5/2005 | Omura .......................... | 257/311 |
| 2008/0128796 | A1 * | 6/2008 | Zhu et al. ...................... | 257/328 |
| 2009/0026523 | A1 * | 1/2009 | Wong et al. ................... | 257/316 |
| 2009/0108376 | A1 * | 4/2009 | Fujii et al. ..................... | 257/401 |
| 2009/0127626 | A1 * | 5/2009 | Zhu et al. ...................... | 257/368 |
| 2011/0101433 | A1 * | 5/2011 | Kim ............................. | 257/296 |
| 2011/0127612 | A1 * | 6/2011 | Cha et al. ...................... | 257/368 |
| 2014/0332826 | A1 * | 11/2014 | Wang et al. .................... | 257/88 |

FOREIGN PATENT DOCUMENTS

JP      9-298243 A     11/1997

* cited by examiner

*Primary Examiner* — Dao H Nguyen
*Assistant Examiner* — Tram H Nguyen (57) ABSTRACT

A semiconductor device has a first and second transistors formed on an active region defined by an insulating region. The active region is divided into a first and second portions arranged in a first direction, and into a third and fourth portions interposed between the first portion and the second portion, and provided adjacent to each other in a second direction orthogonal to the first direction. The first transistor is provided in the first and third portions, and the second transistor is provided in the second and fourth portions.

20 Claims, 10 Drawing Sheets

ELECTRONIC DEVICE WITH AN ACTIVE REGION AND TRANSISTORS

This application is based upon and claims the benefit of priority from Japanese patent application No. 2012-126969, filed on Jun. 4, 2012, the disclosure of which is incorporated herein in its entirety by reference.

BACKGROUND OF THE INVENTION

1. Field of the Invention

This invention relates to a semiconductor device.

2. Description of Related Art

Figure 7:
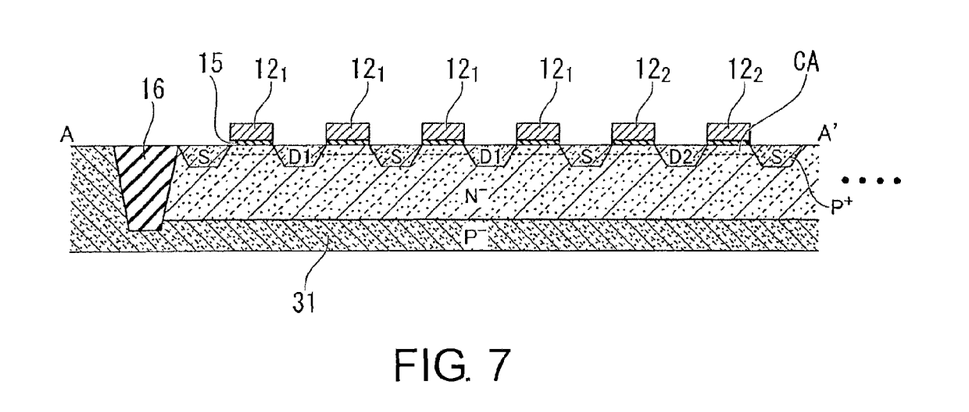
FIG. 7 is a cross-sectional view taken along the line A-A' of FIG. 5.

Japanese Patent Application Publication No. H09-298243 (Patent Document 1) discloses a layout in which a plurality of transistors are repeatedly arranged (see FIG. 7)

SUMMARY

The inventor of this invention studied layouts in which a plurality of transistors are repeatedly arranged to find one which enables more efficient arrangement of the transistors.

In one embodiment, there is provided a device that includes first and second transistors formed in an active region defined by an insulating region. The active region is divided into first and second portions arranged in a first direction, and into third and fourth portions each interposed between the first and second portions and arranged side by side in a second direction orthogonal to the first direction. The first transistor is formed in the first and third portions, and the second transistor is formed in the second and fourth portions.

In another embodiment, there is provided a device that includes a semiconductor substrate including an active region. A first gate electrode is provided on the active region, arranged along a first direction and including a first, second, third, and a fourth portion and further including a fifth portion connecting one ends of the third and fourth portions. A second gate electrode is provided on the active region, including a sixth portion extending in a second direction, a seventh portion extending in the second direction, adjacent to the sixth portion, an eighth portion extending in the second direction, adjacent to the seventh portion, and provided in range with the fourth portion of the first gate electrode, a ninth portion extending in the second direction, adjacent to the eighth portion, and provided in range with the third portion of the first gate electrode, and a tenth portion connecting one ends of the eighth and ninth portions. Diffusion regions are provided in the active region except regions thereof corresponding to the first and second gate electrodes.

In still another embodiment, there is provided a device that includes a first transistor including a first transistor portion and a second transistor portion having different sizes from each other.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

In order to facilitate understanding of the invention, Comparative Examples which the inventor has studied will be described.

Figure 1:
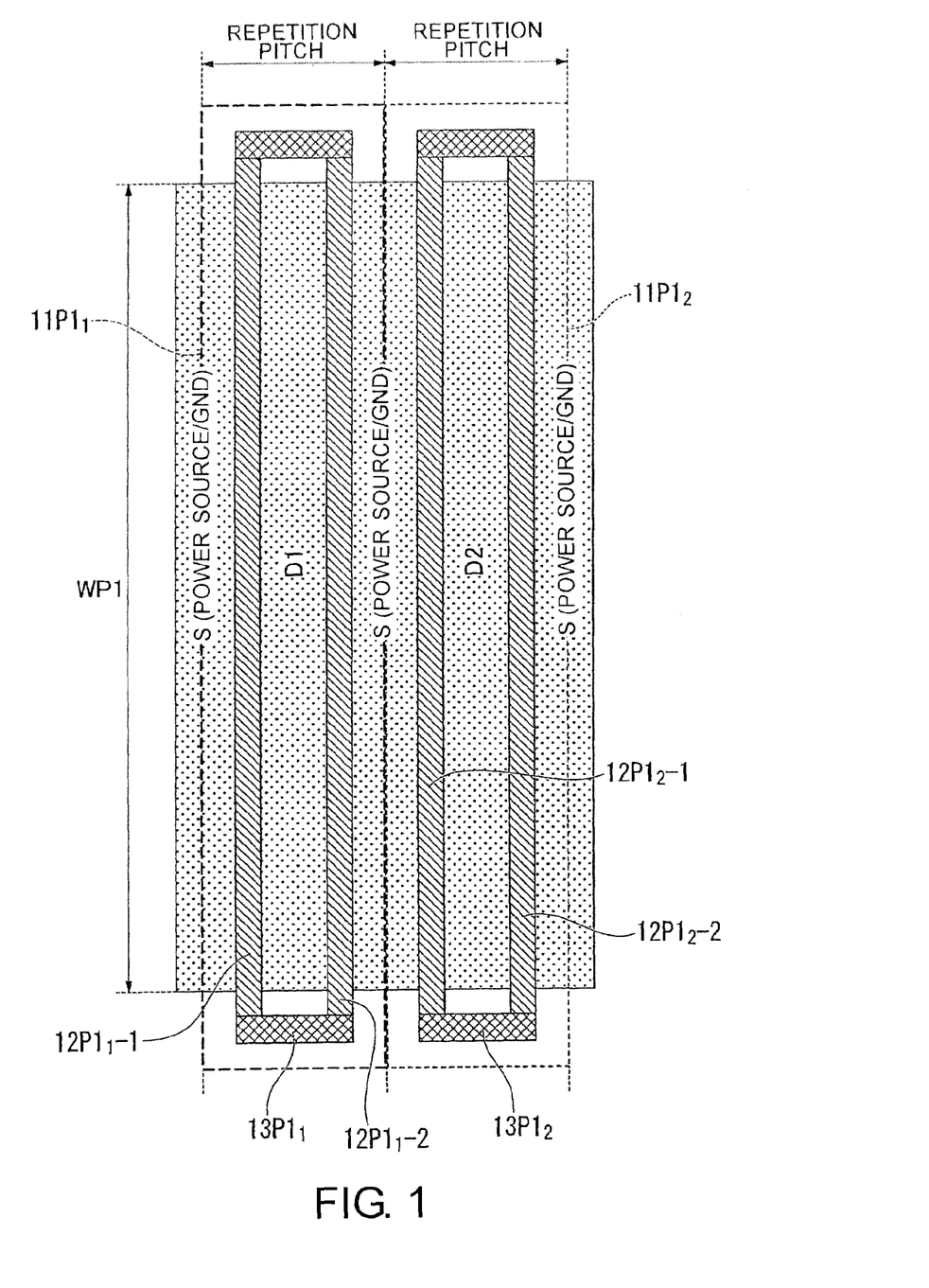
FIG. 1 is a diagram for explaining Comparative Example 1.

One of known layouts in which a plurality of transistors are repeatedly arranged is shown for example in FIG. 1 (Comparative Example 1). In this layout, each transistor includes two gate electrodes. Two adjacent transistors $11P1_1$, $11P1_2$ shares a source region S between the two transistors.

In the layout shown in FIG. 1, the gate width WP1 should be set greater (for example, WP1>10 μm) in order to increase the amount of current in the transistors $11P1_1$, $11P1_2$. When this is done, in the process for forming channel gate electrodes $12P1_1$-1, $12P1_1$-2, $12P1_2$-1, $12P1_2$-1, channel gate electrodes $12P1_1$-1, $12P1_1$-2, $12P1_2$-1, $12P1_2$-2 may fall down in the course of etching that is done after the formation thereof. This may be for a reason that the gate width WP1 is too great while the width of the channel gate electrodes is too small. In other words, attached portions of the channel gate electrodes $12P1_1$-1, $12P1_1$-2, $12P1_2$-1, and $12P1_2$-2 are separated from an under layer by an etching solution whereby the channel gate electrodes cannot be supported any more.

Figure 2:
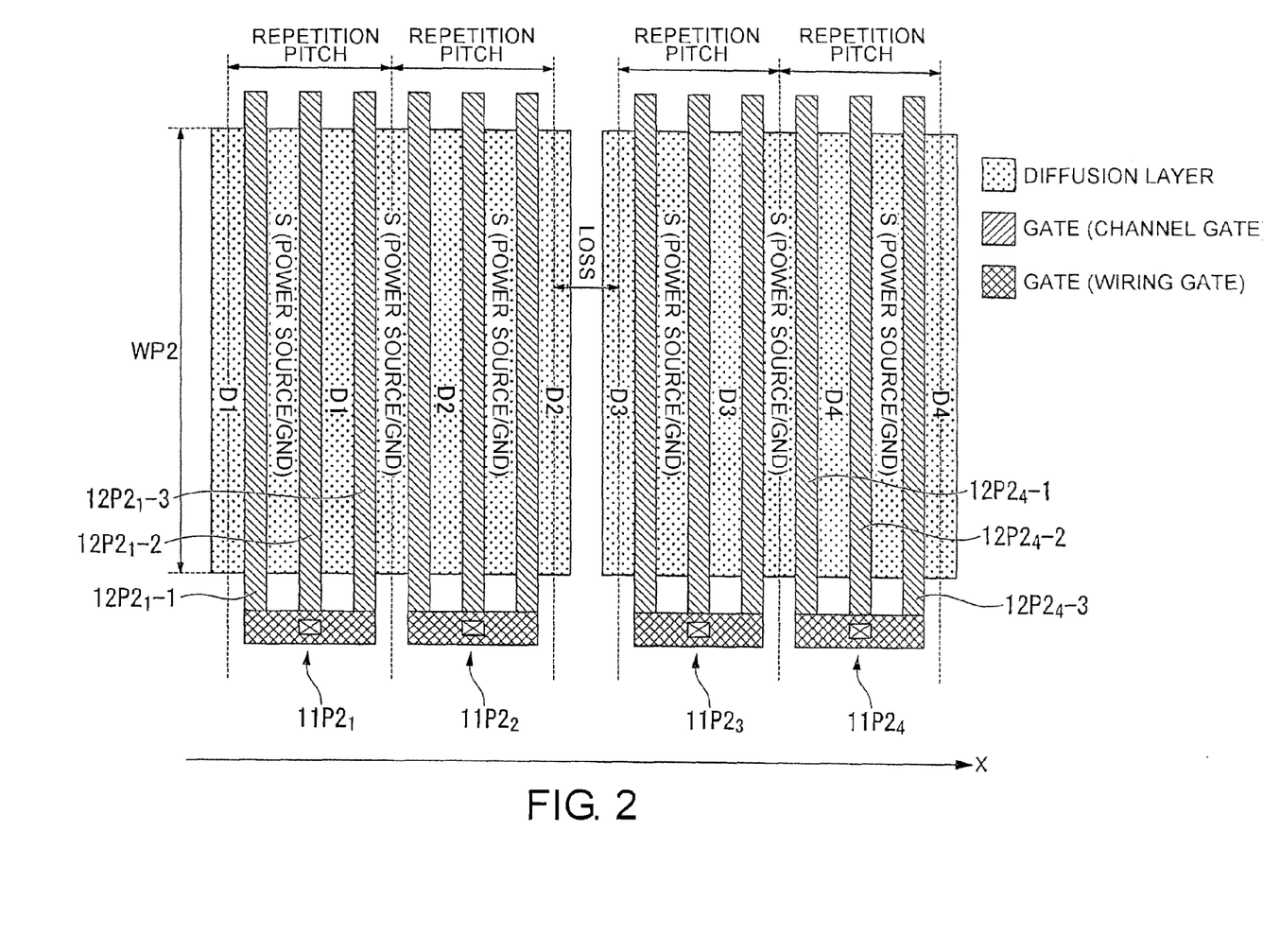
FIG. 2 is a diagram for explaining Comparative Example 2.

Therefore, measures should be taken to increase the amount of current in the transistor without increasing the gate width WP1. This can be realized by designing the layout, as shown in FIG. 2 (Comparative Example 2), for example, such that transistors each having three channel gate electrodes are repeatedly arranged. Although this can increase the amount of current, this layout includes a useless region in which the source region S cannot be shared by adjacent transistors (between the transistors $11P2_2$ and $11P2_3$). This eventually makes the length in X direction in which the transistors are arranged even longer by that much of the length of the useless region, leading to increase in area.

Figure 3:
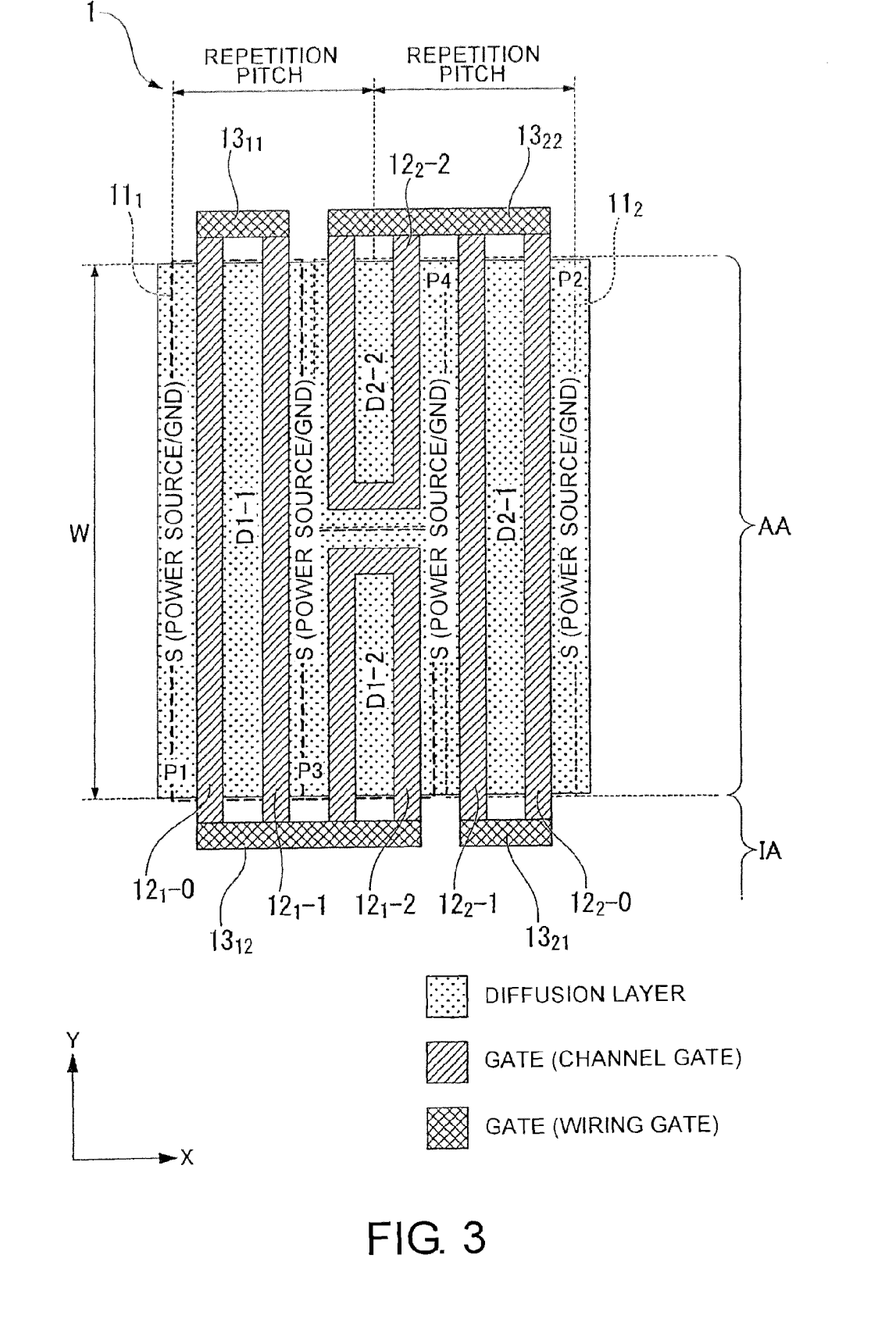
FIG. 3 is a drawing showing a layout of two transistors included in the semiconductor device according to a first embodiment of the invention.

Thus, in the semiconductor device according to the first embodiment of the invention, as shown in FIG. 3, portions P3 and P4 are obtained by dividing the active region AA in a Y direction are provided with gate electrodes of separate transistors to define drain regions. This makes it possible to increase the amount of current of the transistors without increasing the gate width W and without generating a useless region. In addition, the gate width W can be 2/3·WP1.

Exemplary embodiments of the invention will be described in detail with reference to the drawings.

First Embodiment

FIG. 3 is a diagram showing a layout of two transistors included in the semiconductor device 1 according to the first embodiment of the invention.

The active region AA is defined by an insulating region IA, and is selectively formed in a semiconductor substrate. The first and second transistors $11_1$ and $11_2$ are formed in this active region AA. The active region AA is distinguished into portions P1 and P3 where the first transistor $11_1$ is formed, and portions P2 and P4 where the second transistor $11_2$ is formed. These portions P1 and P2 are juxtaposed in an X direction (the first direction). The portions P3 and P4 are interposed between the portions P1 and P2 and are juxtaposed adjacent to each other in Y direction (the second direction). Typically, the area of the portion P1 is equal to the area of the portion P2, and the area of the portion P3 is equal to the area of the portion P4. The area of the portions P3 and P4 is substantially a half of the area of the portions P1 and P2.

The first transistor $11_1$ includes a first transistor portion formed in the portion P1 and a second transistor portion formed in the portion P3. The first transistor portion includes a pair of channel gate electrodes $12_1$-0 and $12_1$-1 (the first channel gate electrode $12_1$-0 and the fifth channel gate electrode $12_1$-1), and a drain region D1-1 which are located between the channel gate electrodes $12_1$-0 and $12_1$-1, and a source region S for a power source (PS) or ground (GND). The second transistor portion is formed to include a U-shaped channel gate electrode $12_1$-2 (second channel gate electrode $12_1$-2), a drain region D1-2 located in the inside of the U-shaped gate electrode $12_1$-2 and a source region S for power source (PS) or ground (GND). These two drain regions D1-1 and D1-2 together may be collectively referred to as a first drain region D1.

One ends of the two channel gate electrodes $12_1$-0 and $12_1$-1 is electrically connected to each other by means of a wiring gate electrode $13_{11}$. Moreover, the other ends of the channel gate electrodes $12_1$-0 and $12_1$-1 and the opposite ends of the channel gate electrode $12_1$-2 are electrically connected to each other by means of a wiring gate electrode $13_{12}$. The wiring gate electrodes $13_{11}$ and $13_{12}$ are provided outside the active region AA. These wiring gate electrodes $13_{11}$ and $13_{12}$ are formed over an insulating region IA, for example, defining the active region AA. The wiring gate electrodes $13_{11}$ and $13_{12}$ together may be collectively referred to as a first wiring gate electrode $13_1$. The channel gate electrodes $12_1$-0, $12_1$-1, $12_1$-2, and the first wiring gate electrode $13_1$ together may collectively referred to as a first gate electrode.

The second transistor $11_2$ provided adjacent to the first transistor $11_1$ includes a third transistor portion formed in the portion P2 and a fourth transistor portion formed in the portion P4. The planar layout of the second transistor $11_2$ is substantially the same as the planar layout obtained by turning that of the first transistor $11_1$ by 180 degrees.

The third transistor portion includes a pair of channel gate electrodes $12_2$-0 and $12_2$-1 (a third channel gate electrode $12_2$-0 and a sixth channel gate electrode $12_2$-1), a drain region D2-1 located between the channel gate electrodes $12_2$-0 and $12_2$-1, and a source region S for power source (PS) or ground (GND). The fourth transistor portion is composed of a U-shaped channel gate electrode $12_2$-2 (fourth channel gate electrode $12_2$-2), a drain region D2-2 located inside thereof, and a source region S for power source (PS) or ground (GND). The two sides of the channel gate electrode $12_1$-2 opposing across the drain region D2-2 are arranged such that they are aligned linearly with the two sides of the channel gate electrode $12_1$-2 opposing across the drain region D1-2. The two drain regions D2-1 and D2-2 together may be collectively referred to as the second drain region D2.

One ends of the two channel gate electrodes $12_2$-0 and $12_2$-1 are electrically connected to each other by means of a wiring gate electrode $13_{21}$. The other ends of the channel gate electrodes $12_2$-0 and $12_2$-1 and the opposite ends of the channel gate electrode $12_2$-2 are electrically connected to each other by means of a wiring gate electrode $13_{22}$. The wiring gate electrodes $13_{21}$ and $13_{22}$ are provided outside the active region AA. These wiring gate electrodes $13_{21}$ and $13_{22}$ are formed on an insulating region IA, for example, defining the active region AA. The wiring gate electrodes $13_{21}$ and $13_{22}$ together may be collectively referred to as a second wiring gate electrode $13_2$. The channel gate electrodes $12_2$-0, $12_2$-1, $12_2$-2, and the second wiring gate electrode $13_2$ together may be collectively referred to as a second gate electrode.

A channel area is formed under (on the rear side as viewed in the drawing) each of the channel gate electrodes. The channel area formed under the channel gate electrodes $12_1$-0, $12_1$-1, $12_2$-0 and $12_2$-1 are straight channels extending in a Y direction. The lengths of these straight channels in the Y direction are substantially all the same. The channel areas formed under the channel gate electrodes $12_1$-2 and $12_2$-2 also have a U-shape.

The drain regions D1-1, D1-2, D2-1 and D2-2 are formed by diffusing an impurity in the active region AA. These drain regions are formed to be separated from each other. The drain regions D1-1 and D1-2 are electrically connected to each other by means of an upper layer wiring, as described later. The drain regions D2-1 and D2-2 are also electrically connected to each other by means of an upper layer wiring. The source regions S for power source or ground are shared by the first transistor $11_1$ and the second transistor $11_2$. The source regions S for power source or ground located between the first transistor $11_1$ and the second transistor $11_2$ are formed in continuation with each other. The source regions S for power source or ground separated from each other are electrically connected to each other by means of an upper layer wiring.

In the configuration as described above, the first to fourth transistor portions formed in the four portions of the active region operate as two transistors.

When each of the first transistor $11_1$ and the second transistor $11_2$ is deemed as a structural unit, it can be said that the first gate electrode includes first to fourth portions ($12_1$-0, $12_1$-1 and two parts of $12_1$-2) extending in a Y direction and arranged in an X direction, and a fifth portion (the remaining part of $12_1$-2) electrically connecting one ends of the third and fourth portions (the two parts of $12_1$-2). In this case, it can be said that the second gate electrode includes sixth to ninth portions ($12_2$-0, $12_2$-1 and two parts of $12_2$-2) extending in the Y direction and arranged in the X direction, and a tenth portion (the remaining part of $12_2$-2) electrically connecting one ends of the eighth and ninth portions (the two parts of $12_2$-2). It can be said that the first gate electrode further includes an eleventh portion ($13_{11}$) electrically connecting ones of the first and second portions ($12_1$-0, $12_1$-1), and a twelfth portion ($13_{12}$) electrically connecting the other ends of the first to fourth portions. Likewise, it can be said that the second gate electrode further includes a thirteenth portion ($13_{21}$) electrically connecting one ends of the sixth and seventh portions ($12_2$-0, $12_2$-1), and a fourteenth portion ($13_{22}$) electrically connecting the other ends of the sixth to ninth portions.

Figure 4:
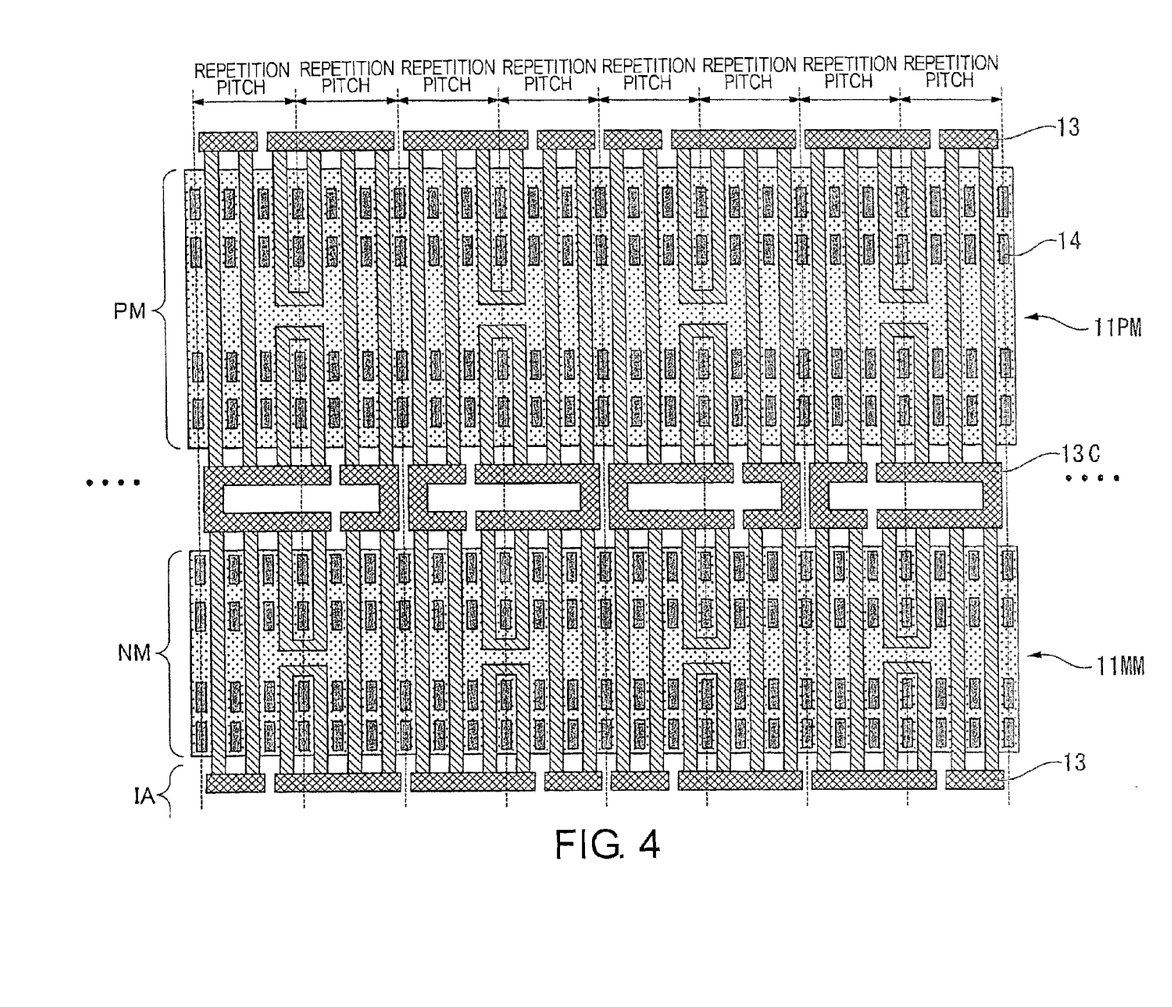
FIG. 4 is a drawing showing a layout when a plurality of inverter circuits are formed using the transistor layout shown in FIG. 3.

FIG. 4 is a diagram showing a layout when a plurality of inverter circuits are configured by using the transistor layout shown in FIG. 3. As seen from FIG. 4, a plurality of PMOS transistors (FETs) 11PM are repeatedly arranged in a PMOS region PM, while a plurality of NMOS transistors 11NM are repeatedly arranged in an NMOS region NM. Each of the PMOS transistors 11PM is connected to a corresponding NMOS transistor 11NM via a wiring gate electrode 13C. There are arranged in the power-source (PS) source regions $S_{PS}$ and the ground (GND) source regions $S_{GND}$, a plurality of contact plugs 14. These contact plugs 14 are connected to upper layer wirings (not shown).

Figure 5:
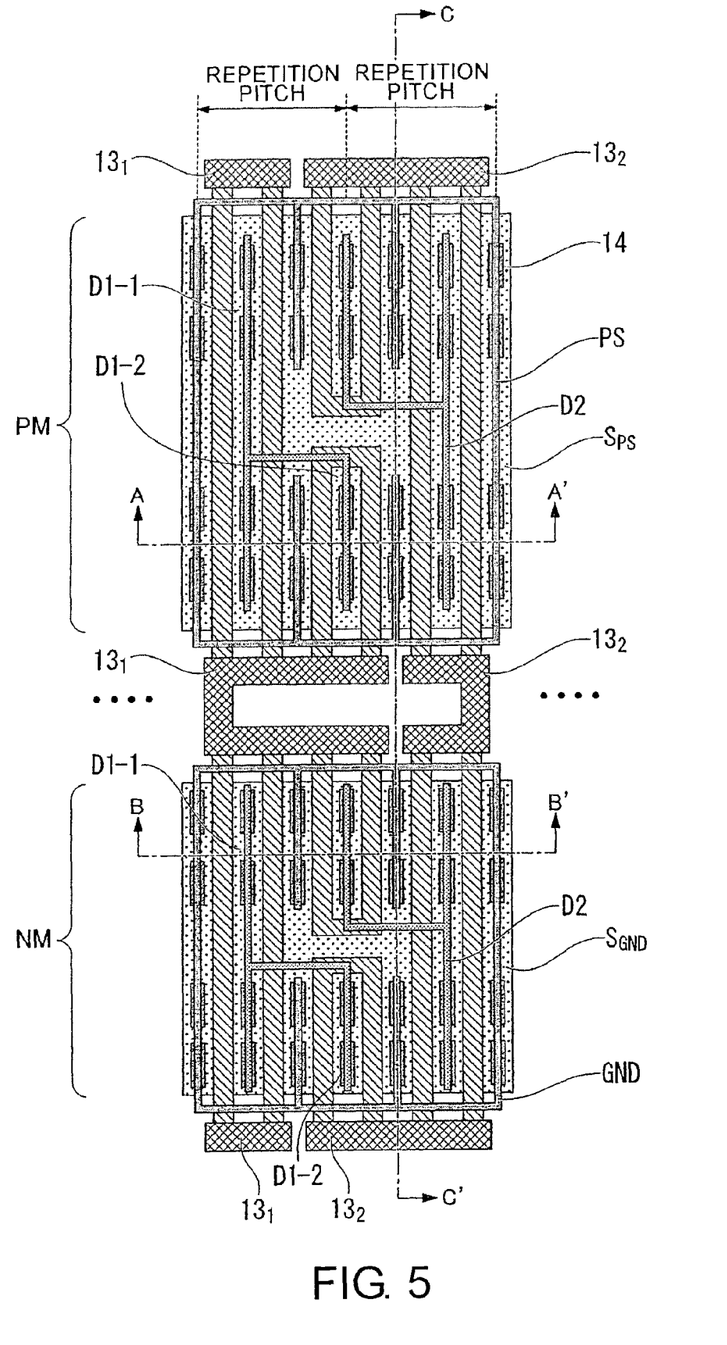
FIG. 5 is a layout diagram showing a part of FIG. 4.

FIG. 5 is a layout diagram showing a part of FIG. 4. FIG. 5 shows the upper layer wirings that are not shown in FIG. 4. In FIG. 5, the contact plugs 14, which are provided on each of the power-source regions $S_{PS}$ provided on the PMOS region PM, are connected to the same wiring (upper layer wiring). In other words, the power-source regions $S_{PS}$ in the PMOS region PM are connected to in common in electrical terms and are supplied with a supply voltage (VDD, for example) in common via the wiring. Two drain regions in each of the transistors 11PM are connected to each other via an upper layer wiring through the contact plugs 14 provided thereon. For example, the two drain regions D1-1, D1-2 corresponding to a single transistor 11PM are connected to each other with an upper layer wiring via the contact plugs 14.

Likewise, the contact plugs 14, which are provided on each of the ground source regions $S_{GND}$ provided in the NMOS region NM, are connected to the same wiring. Specifically, the ground source regions $S_{GND}$ in the NMOS region N are connected in common in electrical terms and are supplied with a ground voltage (GND) in common via the upper layer wiring. The two drain regions in each of the transistors 11NM are connected to each other with an upper layer wiring via the contact plugs 14 provided thereon. For example, the two drain regions D1-1, D1-2 corresponding one transistor 11NM are connected to each other with the upper layer wiring via the two contact plugs 14 provided in that regions.

Figure 6:
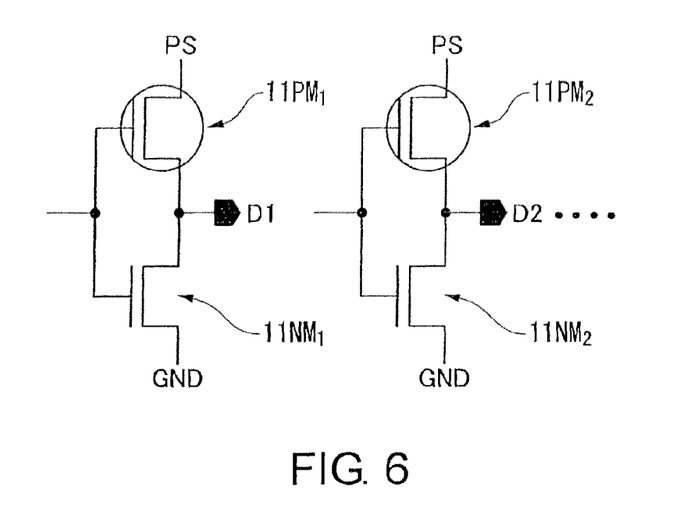
FIG. 6 is a circuit diagram showing inverter circuits arranged repeatedly.

FIG. 6 is a circuit diagram showing inverter circuits arranged repeatedly. Specifically, the inverter circuits each of which is formed by a pair of a PMOS transistor 11PM and an NMOS transistor 11NM are arranged repeatedly.

FIG. 7 is cross-sectional view taken along the line A-A' of FIG. 5. In FIG. 7, the upper layer wirings are omitted. As shown in FIG. 7, four portions (three channel gate electrodes) $12_1$ included in the first gate electrode and two portions (two channel gate electrodes) $12_2$ included in the second gate electrode are juxtaposed on the channel areas CA of the silicon substrate 31 via the gate insulating films 15. There are formed between these juxtaposed portions, the power-source regions $S_{PS}$ and three drain regions functioning as the two drain regions D1 and D2. An isolation insulating film 16 is formed by a STI (Sallow Trench Isolation) method, around the active region AA.

Figure 8:
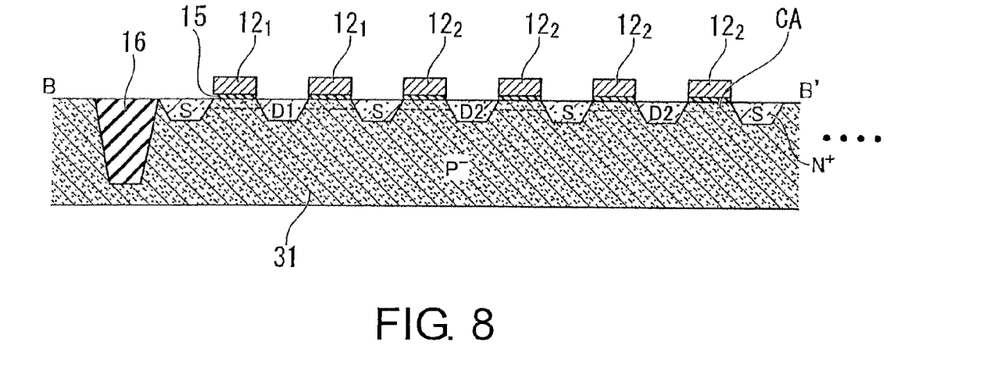
FIG. 8 is a cross-sectional view taken along the line B-B' of FIG. 5.

FIG. 8 is a cross-sectional view taken along the line B-B' of FIG. 5. Like FIG. 7, the upper layer wirings are omitted in FIG. 8. As shown in FIG. 8, two channel gate electrodes $12_1$ included in the first gate electrode and three channel gate electrodes $12_2$ (four portions) included in the second gate electrode are juxtaposed on the channel areas CA in the silicon substrate 31 via the gate insulating films 15. There are formed between these juxtaposed portions, the ground source regions $S_{GND}$ and three drain regions functioning as two drain regions D1 and D2. An isolation insulating film 16 is formed around the active region AA by a STI method.

Figure 9:
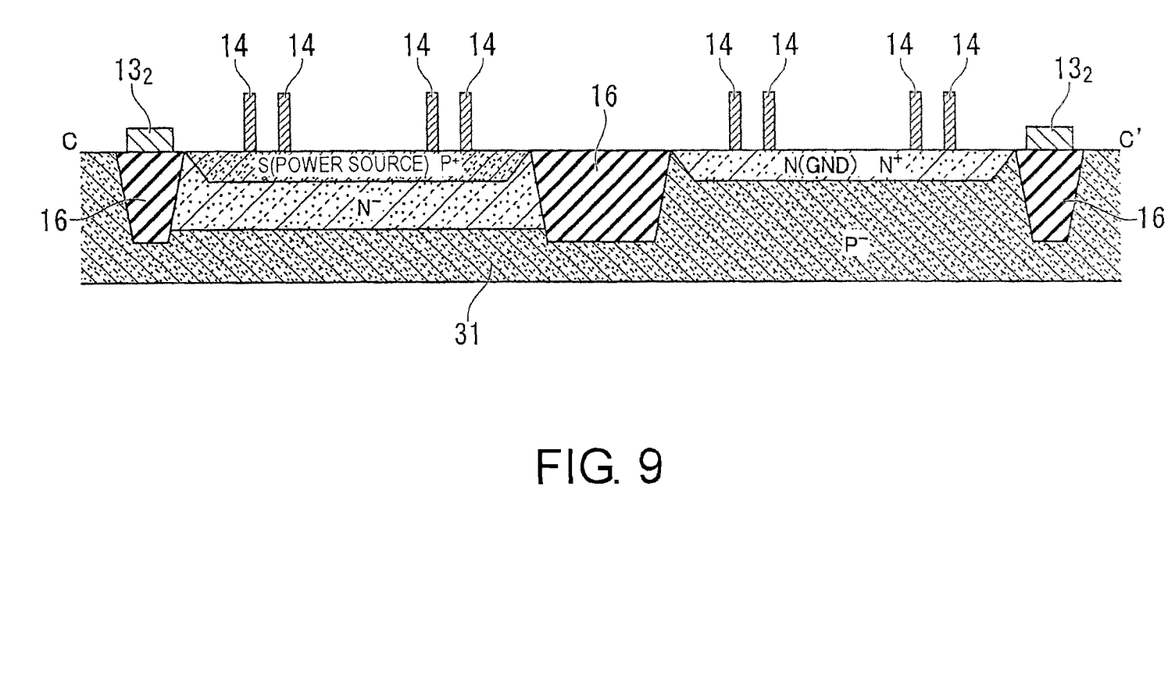
FIG. 9 is a cross-sectional view taken along the line C-C' of FIG. 5.

FIG. 9 is a cross-sectional view taken along the line C-C' of FIG. 5. In FIG. 9 as well, the upper wiring layer is omitted. As shown in FIG. 9, the wiring gate electrodes 13 are each formed on the STI insulating film 16. A plurality of contact plugs 14 connected with the corresponding same wirings are provided.

Figure 10:
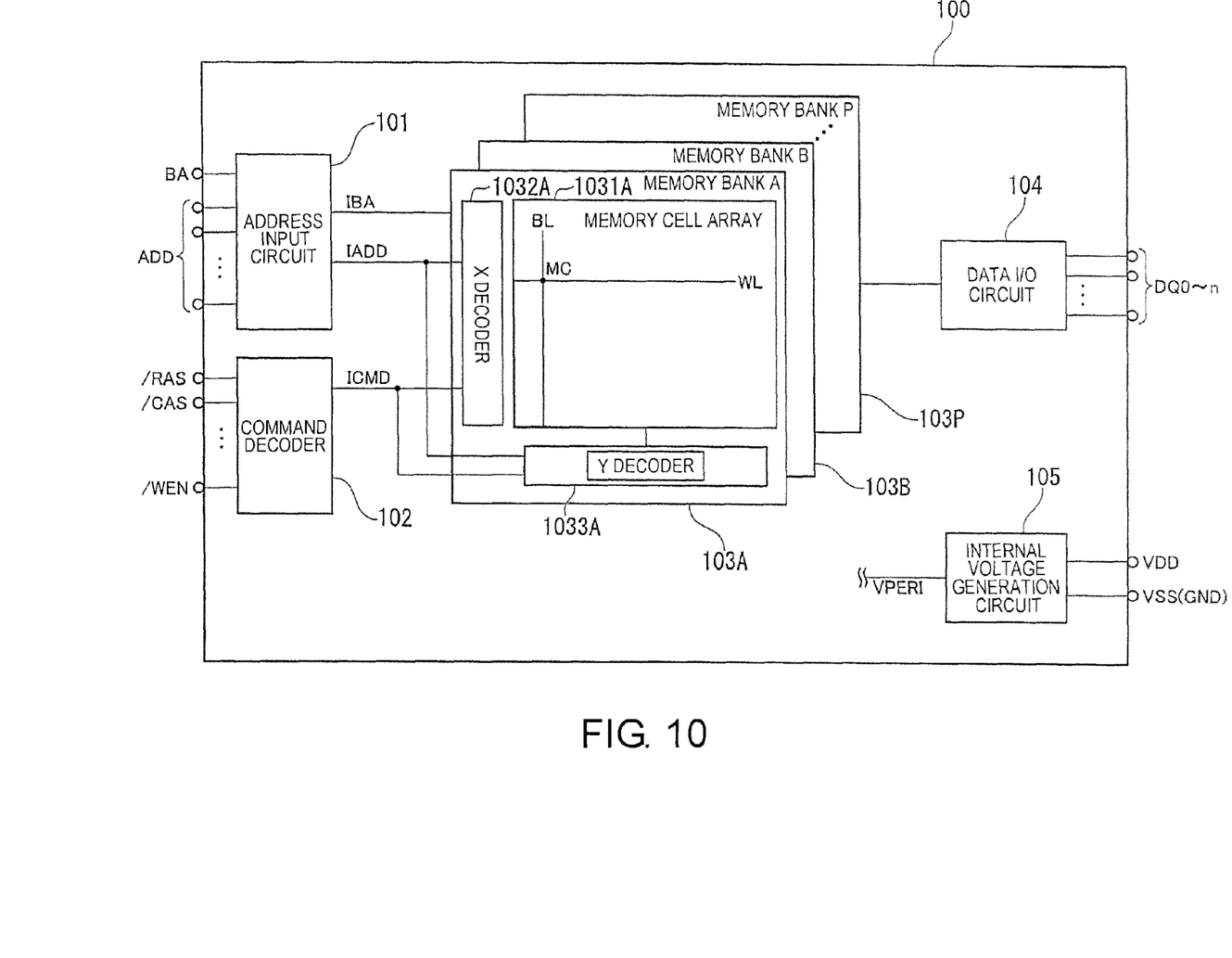
FIG. 10 is a diagram showing an example of a semiconductor device according to the first embodiment.

FIG. 10 is a diagram showing a specific example of the semiconductor device (semiconductor memory device) according to the first embodiment. The layout as shown in FIG. 4, in which a plurality of inverter circuits are repeatedly arranged, is applicable, for example, to a Y decoder circuit 1033A shown in FIG. 10. However, the invention is not limited to this, but is applicable to any part as long as it has a plurality of transistors arranged repeatedly.

The semiconductor memory device 100 shown in FIG. 10 has an address input circuit 101, a command decoder 102, a plurality of memory banks 103A, 103B, . . . , 103P, a data input/output circuit 104, and an internal voltage generation circuit 105. Each of the memory banks 103 has a memory cell array 1031, an X decoder 1032, and a Y decoder 1033.

The address input circuit 101 receives input of bank address BA and X/Y address ADD. The bank address IBA to be output by the address input circuit 101 is supplied to the memory banks as information to select one of the memory banks 103A, 103B, . . . , 103P. The X address and the Y address included in the X/Y address IADD are respectively fed to the X decoder 1032 and the Y decoder 1033 of the selected bank so that they are decoded. A memory location in the memory cell array 1031 is identified based on results of decoding.

The command decoder 102 receives input of a command signal such as row (X) address strobe signal /RAS, column (Y) address strobe signal /CAS, write enable signal /WEN or the like. The symbol "/" as used herein indicates "low active". An operation mode, such as read from or write into the memory cell array 1031, is determined based on the command signals. An operation mode of the data input/output circuit 104 is designated by the command decoder 102. In the state that a memory location to be processed is specified by the X decoder 1032 and the Y decoder 103, the data input/output circuit 104 performs data input/output processing (data DQ0~n) for the specified memory location according to the designated operation mode.

The first embodiment as described above enables efficient arrangement of a plurality of transistors provided with high current driving capacity without increasing the gate width. In other words, the integration degree of a circuit having a plurality of transistors arranged repeatedly can be improved. Further, this can be done without increasing the gate width of the circuits arranged. Moreover, since the gate width of the circuits is not increased, the risk of the gate electrodes collapsing can be eliminated.

Second Embodiment

Figure 11:
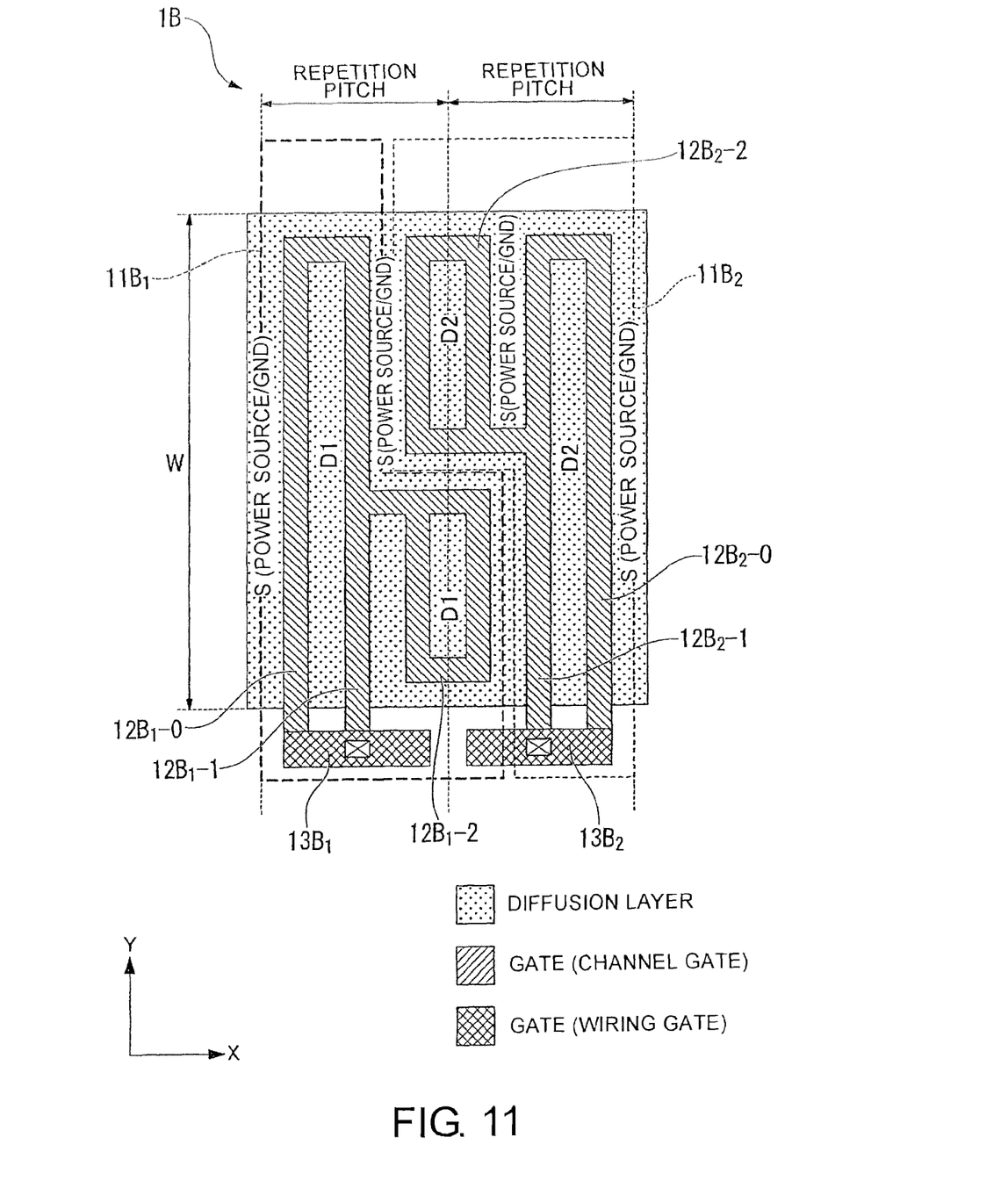
FIG. 11 is a diagram showing a layout of two transistors included in a semiconductor device according to a second embodiment of the invention.

FIG. 11 is a diagram showing a layout of two transistors included in a semiconductor device according to a second embodiment of the invention. The following description will be made only on elements and components different from the first embodiment while description of like elements and components to those of the first embodiment will be omitted.

A semiconductor device 1B according to the second embodiment shown in FIG. 11 has a first transistor $11B_1$ and a second transistor $11B_2$. The first transistor $11B_1$ includes three channel gate electrodes $12B_1$-0, $12B_1$-1, and $12B_1$-2, while the second transistor $11B_2$ includes three channel gate electrodes $12B_2$-0, $12B_2$-1, and $12B_2$-2.

One ends of the channel gate electrode $12B_1$-0 and the channel gate electrode $12B_1$-1 are connected to each other to form a U shape. The channel gate electrode $12B_2$-0 and the channel gate electrode $12B_2$-1 are connected to each other to from a U shape. While the channel gate electrodes $12_1$-2 and channel gate electrode $12_2$-2 of the semiconductor device 1 according to the first embodiment have a U shape, the channel gate electrodes $12B_1$-2 and channel gate electrode $12B_2$-2 in the semiconductor device 1B according to the second embodiment have a (squared) ring-like shape. The channel gate electrode $12B_1$-1 and the channel gate electrode $12B_1$-2 are connected to each other by extending one side of the channel gate electrode $12B_1$-2. Likewise, the channel gate electrode $12B_2$-1 and the channel gate electrode $12B_2$-2 are connected to each other by extending one side of the channel gate electrode $12B_1$-2.

According to the second embodiment, the channel gate electrode can be prevented from protruding out of the active region AA at one end of the gate electrode. In addition to the advantageous effects of the first embodiment, this provides an additional effect that intervals of the gates can be shielded. Further, the device size can be reduced without degrading the current driving capacity. Although one wiring gate is lost in this second embodiment, the gate electrodes will not collapse since the gate width need not be increased, like the first embodiment.

Although it is assumed in the first and second embodiments that the semiconductor device is a DRAM (Dynamic Random Access Memory), the invention is not limited to a DRAM and is applicable to other semiconductor devices such as SRAMs (Static Random Access Memories), PRAMs (Phase change Random Access Memories), and flash memories. In any case, the invention is applicable to a semiconductor device having a layout in which a plurality of transistors are arranged repeatedly.

It is apparent that the present invention is not limited to the above embodiments, but may be modified and changed without departing from the scope and spirit of the invention.

What is claimed is:

1. A device comprising a first and a second transistor formed in an active region defined by an insulating region, wherein:
the active region is divided into a first and second portions which are arranged in a first direction, and into a third and fourth portion which are interposed respectively between the first and second portions and arranged adjacently to each other in a second direction orthogonal to the first direction;
the first transistor is provided in the first and third portions; and
the second transistor is provided in the second and fourth portions.

2. The device according to claim 1, wherein:
the first transistor has a first gate that includes a first gate portion formed in the first portion and extending in the second direction and a second gate portion formed in the third portion and electrically connected to the first gate portion; and
the second transistor has a second gate that includes a third gate portion formed in the second portion and extending in the second direction and a fourth gate portion formed in the fourth portion and electrically connected to the third gate portion.

3. The device according to claim 2, wherein:
the first gate further has a fifth gate portion formed in the first portion, the fifth gate portion being electrically connected to the first gate portion, and extending in the second direction; and
the second gate further has a sixth gate portion formed in the second portion, the sixth gate portion being electrically connected to the third gate portion, and extending in the second direction.

4. The device according to claim 2, wherein each of the second and fourth gate portions is U-shaped in shape.

5. The device according to claim 2, wherein each of the second and fourth gate portions is ring-shaped in shape.

6. The device according to claim 3, wherein the first, third, fifth and sixth gate portions are substantially equal to one another in length of the second direction.

7. The device according to claim 1, wherein the first portion is substantially equal to the second portion in area, and the third portion is substantially equal to the fourth portion in area.

8. The device according to claim 7, wherein each of the third and fourth portions is equal to about a half of the first portion in area.

9. A device comprising:
a semiconductor substrate including an active region;
a first gate electrode provided on the active region, including a first portion extending in a first direction, a second portion provided adjacently to the first portion extending in the first direction, a third portion provided adjacently to the second portion extending in the first direction, a fourth portion provided adjacently to the third portion extending in the first portion and a fifth portion connecting one ends of the third and fourth portions;
a second gate electrode provided on the active region, including a sixth portion extending in the first direction, a seventh portion provided adjacently to the sixth portion extending in the first direction, an eighth portion provided adjacently to the seventh portion extending in the second direction, a ninth portion provided adjacently to the eighth portion extending in the second direction, and a tenth portion connecting one ends of the eighth and ninth portions; and
diffusion regions provided in the active region except regions thereof corresponding to the first and second gate electrodes;
the fourth portion of the first gate electrode and the eighth portion of the second gate electrode being arranged in line in the first direction, and the third portion of the first gate electrode and the ninth portion of the second gate electrode being arranged in line in the first direction.

10. The device according to claim 9, wherein the ninth portion is adjacent to the second portion.

11. The device according to claim 9, wherein the first, second, sixth and seventh portions are substantially equal to one another in length of the first direction; and
the third and forth portions are shorter than the first and second portions in the first direction; and
the eighth and ninth portions are shorter than the sixth and seventh portions in the first direction.

12. The device according to claim 11, wherein the third, fourth, eighth and ninth portions are substantially equal to one another in length of the first direction.

13. The device according to claim 9, wherein the semiconductor substrate further includes an insulating region defining the active region;
the first gate electrode further includes an eleventh portion provided on the insulating region and connecting one ends of the first and second portions, and a twelfth portion provided on the insulating region and connecting the other ends of the first, second, third and fourth portions;
the second gate electrode further includes a thirteenth portion provided on the insulating region and connecting one ends of the sixth and seventh portions, and a fourteenth portion provided on the insulating region and connecting the other ends of the sixth, seventh, eighth and ninth portions.

14. The device according to claim 9, wherein:
the semiconductor substrate further includes an insulating region defining the active region;

the first gate electrode further includes an eleventh portion connecting one ends of the first and second portions, and a twelfth portion provided on the insulating region and connecting the other ends of the first and second portions;

the second gate electrode further includes a thirteenth portion connecting one ends of the sixth and seventh portions, and a fourteenth portion provided on the insulating region and connecting the other ends of the sixth and seventh portions; and the fifth portion is connected to the second portion and the tenth portion is connected to the seventh portion.

15. A device comprising:
a semiconductor substrate including an insulating region and an active region surrounded by the insulating region, the active region being divided into a first, a second, a third and a fourth portion, the first and second portions being arranged in a first direction, the third and fourth portions being sandwiched between the first and second portions and being arranged in a second direction orthogonal to the first direction;
a first circuit including a first transistor provided in the first portion and a second transistor provided in the third portion, gates of the first and second transistors being electrically coupled to each other, sources of the first and second transistors being electrically coupled to each other, drains of the first and second transistors being electrically coupled to each other; and
a second circuit including a third transistor provided in the second portion and a fourth transistor provided in the fourth portion, gates of the third and fourth transistors being electrically coupled to each other, sources of the third and fourth transistors being electrically coupled to each other, drains of the third and fourth transistors being electrically coupled to each other.

16. The device according to claim 15, wherein gates of the first and third transistors are electrically independent of each other, drains of the first and third transistors being electrically independent of each other, and sources of the first and third transistors being electrically coupled to each other.

17. The device according to claim 15, wherein the first and second portions are substantially the same in area as each other and the third and fourth portions are substantially the same in area as each other.

18. The device according to claim 17, wherein the first portion is substantially twice as large as the third portion.

19. The device according to claim 15, wherein each of the gates of the third and fourth transistors includes portions respectively elongating in the first and second directions and each of the gates of the first and second transistors is free from a portion elongating in the first direction.

20. The device according to claim 19, wherein the portions of the gates of the third and fourth transistors respectively elongating in the second direction are arranged in line in the second direction.

* * * * *